US008115267B2

(12) United States Patent
Miura

(10) Patent No.: US 8,115,267 B2
(45) Date of Patent: Feb. 14, 2012

(54) SEMICONDUCTOR DEVICE AND FABRICATION METHOD OF THE SAME

(75) Inventor: Noriyuki Miura, Miyagi (JP)

(73) Assignee: Lapis Semiconductor Co., Ltd. (JP)

( * ) Notice: Subject to any disclaimer, the term of this patent is extended or adjusted under 35 U.S.C. 154(b) by 387 days.

(21) Appl. No.: 12/458,721

(22) Filed: Jul. 21, 2009

(65) Prior Publication Data

US 2010/0019387 A1    Jan. 28, 2010

(30) Foreign Application Priority Data

Jul. 23, 2008  (JP) ................................. 2008-189743

(51) Int. Cl.
  *H01L 31/113*    (2006.01)
(52) U.S. Cl. .................. 257/434; 257/E21.705; 257/84; 257/774; 438/48
(58) Field of Classification Search ........... 257/E21.705, 257/E23.168, 84, 379, 434, 516, 531, 773, 257/774; 438/48, 57, 98
See application file for complete search history.

(56) References Cited

U.S. PATENT DOCUMENTS

| 6,028,344 | A * | 2/2000 | Hashimoto | 257/587 |
|---|---|---|---|---|
| 6,278,131 | B1 * | 8/2001 | Yamazaki et al. | 257/59 |
| 7,268,410 | B1 * | 9/2007 | Hopper et al. | 257/531 |
| 7,364,933 | B2 * | 4/2008 | Kim | 438/65 |
| 7,517,713 | B2 * | 4/2009 | Sumi | 438/57 |
| 7,781,781 | B2 * | 8/2010 | Adkisson et al. | 257/84 |
| 7,821,065 | B2 * | 10/2010 | Murakami et al. | 257/347 |
| 7,825,001 | B2 * | 11/2010 | Uya | 438/401 |
| 7,855,153 | B2 * | 12/2010 | Ichijo et al. | 438/772 |
| 7,875,948 | B2 * | 1/2011 | Hynecek et al. | 257/447 |
| 7,919,348 | B2 * | 4/2011 | Akram et al. | 438/64 |
| 8,003,433 | B2 * | 8/2011 | Pourquier | 438/98 |
| 2006/0226934 | A1 * | 10/2006 | Ohguro | 335/78 |
| 2007/0200113 | A1 * | 8/2007 | Yamazaki et al. | 257/72 |

FOREIGN PATENT DOCUMENTS

JP       07-335811 A     12/1995
JP       11-354631 A     12/1999

* cited by examiner

*Primary Examiner* — Chris Chu
(74) *Attorney, Agent, or Firm* — Rabin & Berdo, PC

(57) ABSTRACT

A semiconductor device which comprises an SOI substrate having an insulating layer between a semiconductor substrate layer and a semiconductor layer in a surface of which a semiconductor element is formed, and at least one external terminal provided, via an insulating film, on a surface of the semiconductor substrate layer and electrically connected to the semiconductor element. The semiconductor device further comprises a contact portion constituted by a conductive film reaching through the insulating film to electrically connect to the semiconductor substrate layer; and a potential fixing electrode provided, via the insulating film, on the surface of the semiconductor substrate layer and connected to the contact portion.

7 Claims, 7 Drawing Sheets

SEMICONDUCTOR DEVICE AND FABRICATION METHOD OF THE SAME

BACKGROUND OF THE INVENTION

1. Field of the Invention

The present invention relates to a semiconductor device and a fabrication method of the semiconductor device, and particularly to a semiconductor device using an SOI substrate.

2. Description of the Related Art

SOI (Silicon On Insulator) devices are structured such that a silicon substrate layer and a thin film silicon layer formed over it (hereinafter called an SOI layer) are separated and insulated by a buried oxide film (BOX layer). By this means, insulating separation between adjacent elements can be easily achieved, and further because a parasitic thyristor is not formed via the silicon substrate layer, a latch-up phenomenon is prevented from occurring. Yet further, constructing transistors in the SOI layer on the insulating film is effective in suppressing the so-called short-channel effect that as transistors become finer, power consumption increases. Still further, because their junction capacitance is smaller than that of transistors of a bulk structure, transistors formed of the SOI structure can operate at higher speed. Since having many excellent characteristics as such, transistors of the SOI structure are expected to be able to achieve higher speed and lower power consumption as compared with conventional semiconductor elements formed in a bulk substrate.

Attempts to apply wafers having this SOI structure (hereinafter called SOI substrates) to UV sensors are being made. Because conventional UV sensors use a compound semiconductor such as gallium nitride, it is difficult to incorporate a peripheral circuit in the same chip. Further, as to UV sensors using a silicon substrate, because they have sensitivity to light over a wide range of wavelengths, there is the problem that an optical filter for blocking visible light is necessary, resulting in production costs being high and the sensitivity being low. As to UV sensors using an SOI substrate, a peripheral circuit such as an operational amplifier can be incorporated in the same chip, and because a photodiode having sensitivity only to UV light can be formed by thinning the SOI layer, they have the merit that a good spectral sensitivity characteristic is obtainable without using an optical filter.

Meanwhile, wafer-level chip size packages (hereinafter called W-CSP) that realize packages of the same size as chips are known as a technology to achieve the miniaturization of semiconductor packages. W-CSP are packages of a new concept wherein the entire assembly process finishes with them remaining in a wafer state.

In W-CSP, a penetrating electrode structure is adopted because the improvement in reliability and the miniaturization of devices can be achieved therewith. Usually, electrodes for a semiconductor device to send/receive signals to/from the outside are formed on the same surface that the semiconductor element is formed in. In contrast, as to the penetrating electrodes, through holes are formed extending from the back side of a chip in a thickness direction of the chip by fine processing technology, and conductor lines are formed inside the through holes, and by connecting the conductor lines to front electrodes, it becomes possible to send/receive signals to/from the back side of the chip, which is usually not used. Further, by laying a plurality of chips one over another with the penetrating electrode technique to form signal transfer paths along a thickness direction of the chips, line lengths are shortened compared with conventional wiring, and thus packaging density can be significantly improved as well as higher speed and higher reliability being achieved.

In these years, optical sensors such as a UV sensor and an image sensor are mounted in mobile apparatuses such as mobile phones, and there is a demand that their packages become further smaller in size. In optical sensors, in the case of providing external terminals on the light receiving surface side, it is necessary to provide terminals in an area outside a light receiving area. Hence, an area on which to provide external terminals that is separate from the light receiving area needs to be secured on a surface of sensor devices, necessarily resulting in an increase in chip size, and thus, it is difficult to meet the demand for the miniaturization of packages. Accordingly, for packages of optical sensors, W-CSP having the penetrating electrode structure is being adopted. That is, in the W-CSP having the penetrating electrode structure, because external terminals are formed on the surface opposite to the light receiving surface, the external terminals can be arranged without being affected by the arrangement of the light receiving area, and also the demand for the reduction of package sizes can be met.

However, packaging SOI devices in the W-CSP structure having penetrating electrodes causes a new problem. That is, in the W-CSP having the penetrating electrode structure, insulating films are usually formed in between a semiconductor substrate and penetrating electrodes, back side lines, and external terminals, which are insulated thereby. Hence, where an SOI substrate is used as the semiconductor substrate, the silicon substrate layer is not connected to any external terminal, thus being floating in potential. If the potential of the silicon substrate layer is floating, the operation of the circuit formed in the SOI layer may become unstable, causing a malfunction. Hence, the potential of the silicon substrate layer of the SOI substrate needs to be fixed.

As a method of fixing the silicon substrate layer of an SOI substrate to ground potential, a configuration where a chip is mounted on a lead frame fixed to ground potential via a conductive adhesive is disclosed in, e.g., Japanese Patent Application Laid-Open Publication No. H07-335811 (Reference 1).

Meanwhile, in Japanese Patent Application Laid-Open Publication No. H11-354631 (Reference 2), there is disclosed the configuration of a semiconductor device where a conductive layer leading from a surface of the SOI layer through the SOI layer and the BOX to the silicon substrate layer is formed and where a substrate potential fixing electrode electrically connected to the conductive layer is formed on the surface of the SOI layer.

However, since the W-CSP having penetrating electrodes is usually mounted on a mounting board via solder balls constituting external terminals, a mounting method which connects the back side of the SOI substrate directly to a lead frame cannot be used. That is, it is difficult to adopt the configuration described in Reference 1 to the W-CSP having the penetrating electrode structure.

Further, the configuration described in Reference 2 cannot be applied, as it is, to packages having external terminals on the back side of the SOI substrate because the substrate potential fixing electrode is formed on the surface of the SOI layer. That is, if the structure described in Reference 2 is applied to the W-CSP having penetrating electrodes, a voltage supply path other than the penetrating electrodes such as one made by wire-bonding will be needed to give a potential to the substrate potential fixing electrode formed on the surface of the chip, resulting in a reduction in the merit of adopting the penetrating electrode structure. Further, since the SOI substrate needs to be etched to form a contact hole reaching the substrate layer, a space where to form the contact hole needs to be secured separately, which may cause an increase in chip size.

SUMMARY OF THE INVENTION

The present invention was made in view of the above-mentioned facts, and an object thereof is to provide a semiconductor device of the W-CSP structure having penetrating electrodes that includes an SOI device, wherein the potential of the silicon substrate layer of the SOI substrate can be fixed without an increase in package size, and a fabrication method of the semiconductor device.

According to the present invention, there is provided a semiconductor device which comprises an SOI substrate having an insulating layer between a semiconductor substrate layer and a semiconductor layer in a surface of which a semiconductor element is formed, and at least one external terminal provided, via an insulating film, on a surface of the semiconductor substrate layer and electrically connected to the semiconductor element. The semiconductor device further comprises a contact portion constituted by a conductive film reaching through the insulating film to electrically connect to the semiconductor substrate layer; and a potential fixing electrode provided, via the insulating film, on the surface of the semiconductor substrate layer and connected to the contact portion.

According to the present invention, there is provided a fabrication method of a semiconductor device which comprises an SOI substrate having an oxide film between a semiconductor substrate layer and a semiconductor layer in a surface of which a semiconductor element is formed; an electrode pad provided on the side facing the semiconductor-element-formed surface of the semiconductor layer and electrically connected to the semiconductor element; a penetrating electrode extending through the SOI substrate to electrically connect to the electrode pad; and an external terminal provided, via an insulating film, on a surface of the semiconductor substrate layer and electrically connected to the penetrating electrode. The method comprises the steps of forming a through hole extending from the surface of the semiconductor substrate layer to the electrode pad; forming the insulating film to cover the surface of the semiconductor substrate layer and the inside wall of the through hole; selectively etching the insulating film such that the electrode pad is exposed at the bottom of the through hole; selectively etching the insulating film to form a contact hole on the surface of the semiconductor substrate layer, thereby making a part of the semiconductor substrate layer exposed; forming a conductive film to cover the surface of the semiconductor substrate layer and the inside wall of the through hole to form the penetrating electrode and a contact portion in the contact hole that is electrically connected to the exposed part of the semiconductor substrate layer; and patterning the conductive film over the surface of the semiconductor substrate layer, thereby forming the external terminal and a potential fixing electrode electrically connected to the contact portion.

According to the semiconductor device and the fabrication method of the semiconductor device of the present invention, in semiconductor devices of the W-CSP structure having an SOI device and penetrating electrodes, potential fixing means for the silicon substrate layer of the SOI substrate can be configured without an increase in package size. That is, the potential fixing external terminal (potential fixing electrode) for supplying fixed potential to the silicon substrate layer is formed on the same surface and of the same structure as the other external terminals, and also an existing external terminal (e.g., a ground (Gnd) terminal) can be used as the potential fixing external terminal. Hence, providing the potential fixing external terminal does not increase the package size.

DETAILED DESCRIPTION OF THE INVENTION

Figure 1A:
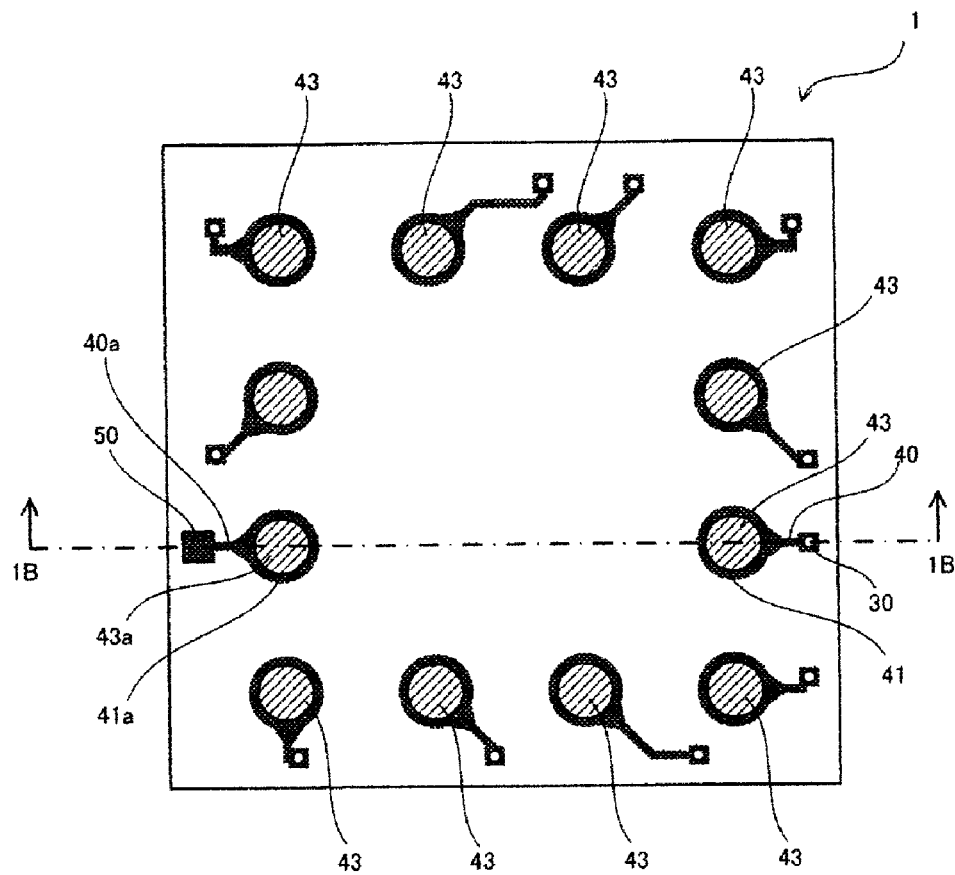
FIG. 1A is a plan view showing the configuration on the back side of a UV sensor that is an embodiment of the present invention.

Embodiments of the present invention will be described below with reference to the accompanying drawings. The same reference numerals are used to denote substantially the same or like constituents or parts throughout the figures cited below.

Figure 1B:
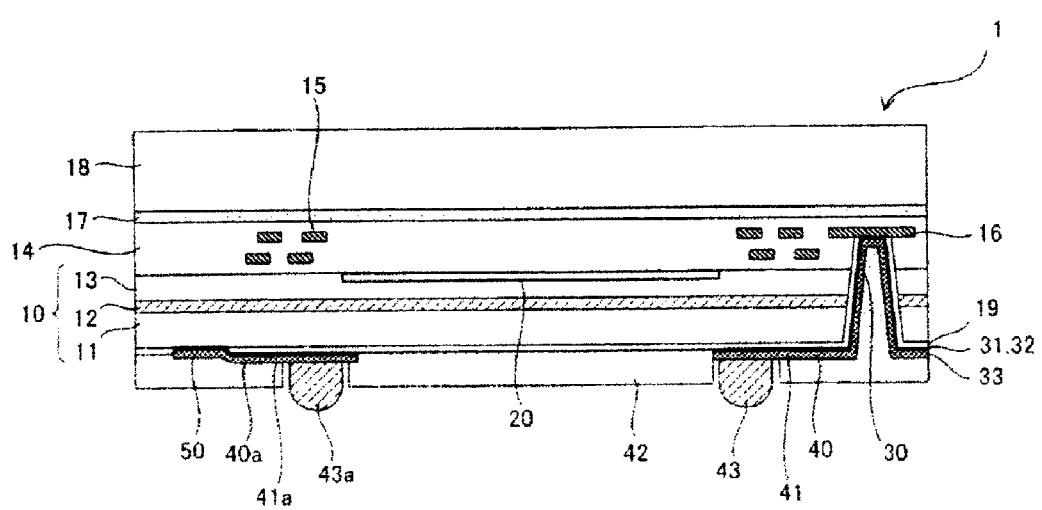
FIG. 1B is a cross-sectional view taken along line 1B-1B of FIG. 1A.

FIG. 1A is a plan view showing the configuration on the back side of a UV sensor 1 using the W-CSP structure having penetrating electrodes according to an embodiment of the present invention, and FIG. 1B is a cross-sectional view taken along line 1B-1B of FIG. 1A. For the UV sensor 1, an SOI substrate 10 is used because of the merits that a photodiode and a peripheral circuit such as an operational amplifier can be mounted in one chip and that the photodiode having sensitivity only to UV light can be formed through thinning the SOI layer in thickness with an optical filter being not used.

The SOI substrate 10 has a three layer structure of a silicon substrate layer 11, a buried oxide film layer (BOX layer) 12, and an SOI layer 13, and a sensor circuit 20 including a photodiode, an operational amplifier, and the like is formed in a surface of the SOI layer 13. That is, the surface of the SOI layer 13 is a light receiving surface. An interlayer insulating film 14 made of, e.g., $SiO_2$ or the like is formed on the SOI substrate, and multilayer structured conductor lines 15 connected to the sensor circuit are formed in the interlayer insulating film 14. Also, electrode pads 16 each connected to a conductor line 15 are provided in the interlayer insulating film 14. The electrode pads 16 are placed near the edge of the SOI substrate 10. A UV-transparent cover glass 18 is stuck onto the interlayer insulating film 14 with a UV-transparent adhesive 17.

In the SOI substrate 10, there is provided a penetrating electrode 30 leading from the silicon substrate layer 11 to the electrode pad 16 in the interlayer insulating film 14. The penetrating electrode 30 is formed by forming a through hole leading from the back side of the SOI substrate 10 to the electrode pad 16 and forming sequentially, e.g., a barrier metal 31 made of Ti, Ti/Ni, or the like, a plating seed film 32 made of Cu or the like, and a plating film 33 made of Cu or the like on the inside wall thereof. These conductive layers forming the penetrating electrode 30 are connected to the electrode pad 16 at the bottom of the through hole and connected to a back side line 40 extending on the back side of the SOI substrate 10. As shown in FIG. 1A, a plurality of the penetrating electrodes 30 are arranged along the outer edge of the UV sensor 1. One back side line 40 electrically connects each penetrating electrode 30 and a corresponding external terminal 43. The external terminal 43 is constituted by a back side electrode pad 41 formed at an end of the back side line 40 and a solder ball provided on the back side electrode pad 41.

On the side walls of the penetrating electrodes 30 and the main surface of the silicon substrate layer 11, there is provided an insulating film 19 made of $SiO_2$ or the like, thereby securing the insulation between the silicon substrate layer 11 and the penetrating electrodes 30, the back side lines 40, and the external terminals 43. A solder resist 42 is formed on the main surface of the silicon substrate layer 11 so as to fill the through holes of the penetrating electrodes 30. Openings are made in the solder resist 42 at positions where the back side electrode pads 41 are formed, and solder bumps constituting the external terminals 43 are provided on the back side electrode pads 41 exposed through the openings. The solder resist 42 prevents solder from flowing out into line areas outside the back side electrode pads 41 by solder reflow performed when mounting the UV sensor 1 on a mounting board. The external terminals 43 are electrically connected to the electrode pads 16 provided on the SOI substrate front side via the back side lines 40 and the penetrating electrodes 30. By this means, the sending/receiving of signals between the back side of the UV sensor 1 and the sensor circuit 20 formed in the SOI layer 13 becomes possible. As such, the UV sensor 1 has the penetrating electrodes and is produced in a package of the same size as the SOI substrate 10.

Because the silicon substrate layer 11 located at the lowest part of the SOI substrate 10 is insulated by the insulating film 19 from the penetrating electrodes 30 and the back side lines 40, a contact to connect to the silicon substrate layer 11 (hereinafter called a substrate layer contact) and an external terminal (hereinafter called a potential fixing external terminal) to give a potential to the silicon substrate layer 11 via the contact are needed to fix the potential of the silicon substrate layer 11. Since the UV sensor 1 is provided on the back side opposite to the light receiving surface with the external terminals 43, it is appropriate that the potential fixing external terminal is also provided on the same surface as the other external terminals 43, in terms of production and package size. Accordingly, in the present embodiment, taking into account this package structure, the substrate layer contact and the potential fixing external terminal connecting to the substrate layer contact are provided on the back side of the UV sensor 1.

Specifically, as shown in FIGS. 1A, 1B, by making a contact hole in the insulating film 19 extending over a surface of the silicon substrate layer 11 to expose a part of the silicon substrate layer 11 at the back side and forming a conductive layer to electrically connect to the silicon substrate layer 11 at the part exposed through the contact hole, a substrate layer contact 50 is formed.

The substrate layer contact 50 is led out onto the main surface of the silicon substrate layer 11 via a back side line 40a. A back side electrode pad 41a is formed at an end of the back side line 40a. A solder ball is provided on the back side electrode pad 41a and constitutes a potential fixing external terminal (potential fixing electrode) 43a. By applying a desired voltage via the potential fixing external terminal 43a, the potential of the silicon substrate layer 11 can be fixed via the back side line 40a and the substrate layer contact 50, thus securing the operation stability of the sensor circuit.

Generally, by putting a semiconductor substrate in direct contact with a metal film, a Schottky barrier is formed, which hampers voltage controllability. Accordingly, where a contact is formed in a semiconductor substrate, a high concentration of impurities is introduced into a surface of the semiconductor substrate by performing ion implantation or so on, thereby obtaining an ohmic contact. However, the substrate layer contact 50 according to the present embodiment is exclusively for fixing the potential of the silicon substrate layer 11, and the voltage controllability and thus the ohmic contact is not needed. Hence, it does not matter whether the contact between the substrate layer contact 50 and the silicon substrate layer 11 is a Schottky contact. Thus, a high concentration of impurities need not be introduced into a part of the semiconductor substrate layer where to form the substrate layer contact 50.

Figure 2:
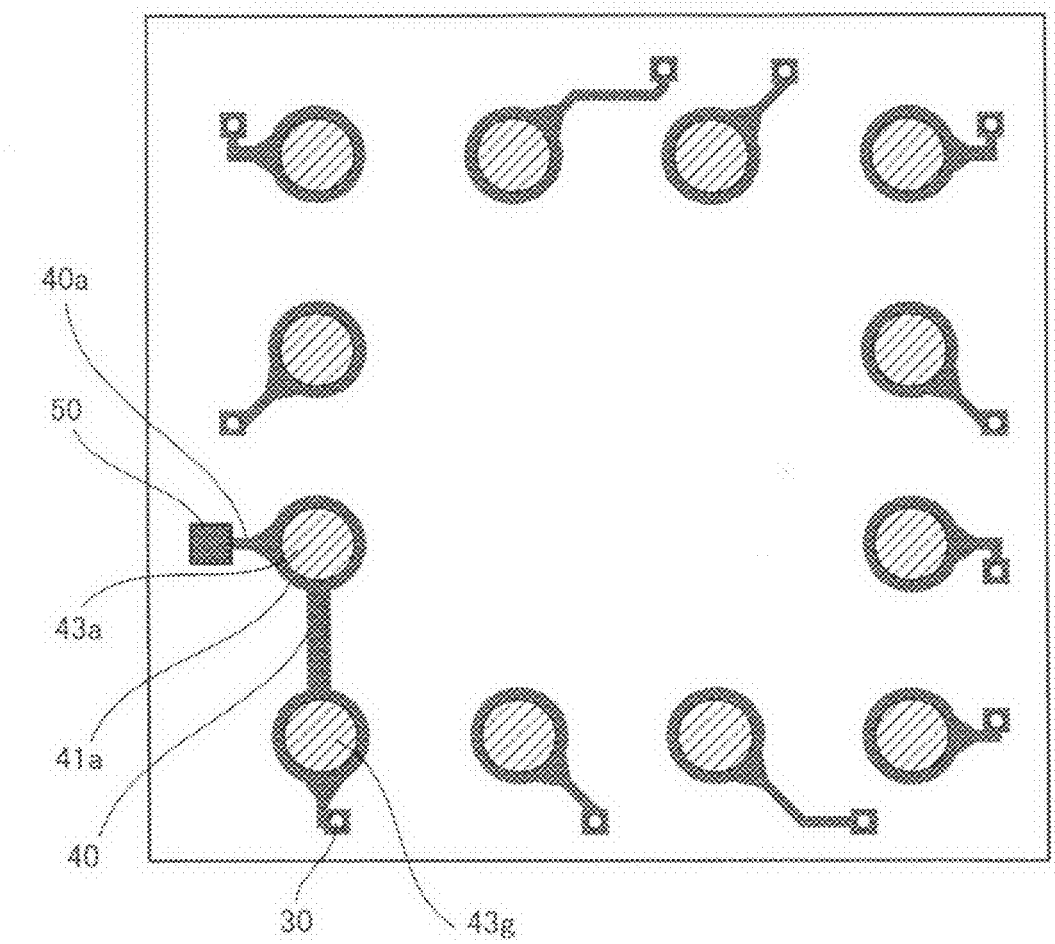
FIG. 2 is a plan view showing the configuration on the back side of a UV sensor that is another embodiment of the present invention.

The configuration shown in FIGS. 1A, 1B shows an example case where the voltage supply side can supply the potential fixing external terminal 43a with a voltage independent of other external terminals 43. In contrast, FIG. 2 shows the configuration of a case where a voltage supplied to another external terminal 43 is used also as a potential fixing voltage for the silicon substrate layer 11. For example, where ground potential (Gnd potential) is used to fix the potential of the silicon substrate layer 11, the potential fixing external terminal 43a is connected to an existing Gnd terminal 43g provided as a functional terminal for the UV sensor via a back side line 40. By this means, for example, the case where the voltage supply side cannot supply the potential fixing external terminal 43a with a voltage independent of other external terminals 43 for its own reason can be dealt with.

Figure 3A:
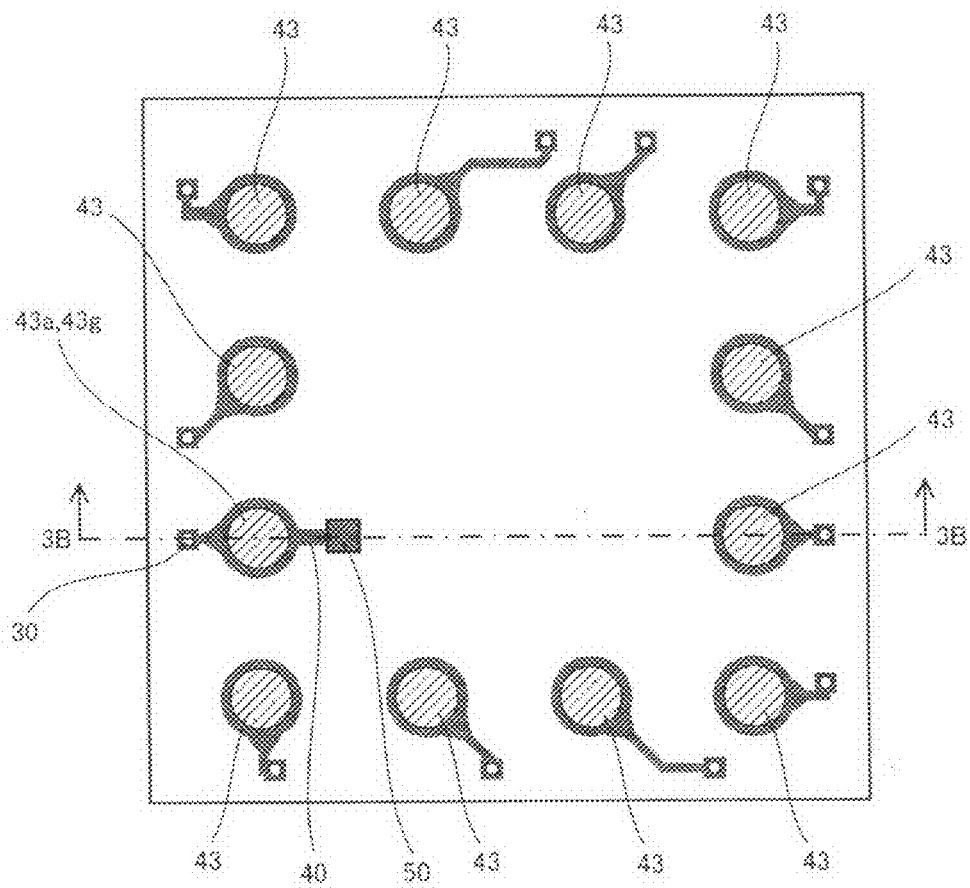
FIG. 3A is a plan view showing the configuration on the back side of a UV sensor that is another embodiment of the present invention.
Figure 3B:
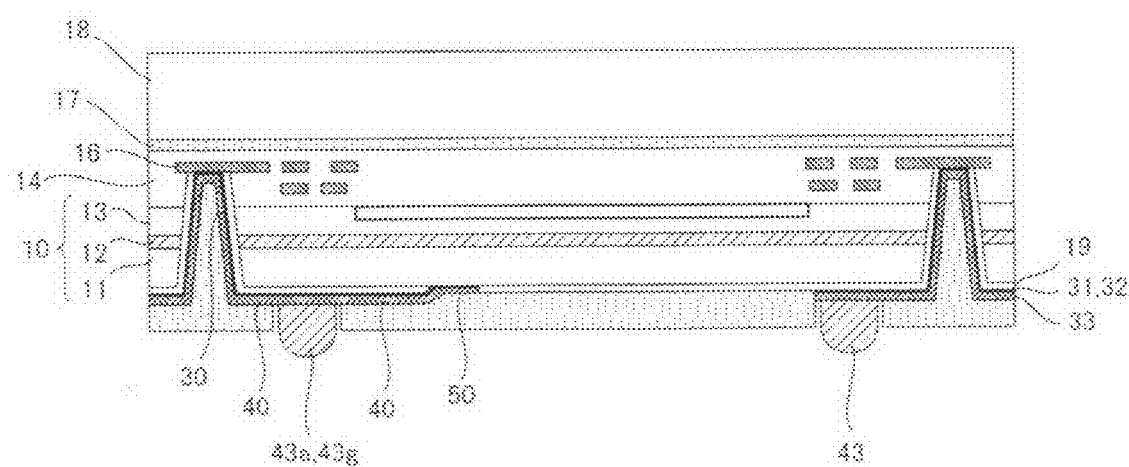
FIG. 3B is a cross-sectional view taken along line 3B-3B of FIG. 3A.

FIGS. 3A, 3B show an example configuration of a case where an existing functional terminal is used also as the potential fixing external terminal, and FIG. 3A is a plan view of the back side of the UV sensor 1, and FIG. 3B is a cross-sectional view taken along line 3B-3B of FIG. 3A. For example, where ground potential (Gnd potential) is used to fix the potential of the silicon substrate layer 11, by using an existing Gnd terminal 43g provided as a functional terminal for the UV sensor also as the potential fixing external terminal 43a, ground potential applied to this Gnd terminal 43g can be used as a potential fixing voltage for the silicon substrate layer 11. In this case, the substrate layer contact 50 is formed near the Gnd terminal 43g and is connected to the Gnd terminal 43g via a back side line 40. With this configuration, the case where the potential fixing external terminal for fixing the potential of the silicon substrate 11 cannot be provided independent of other external terminals because of a spatial restriction or the like can be dealt with.

Figure 4A:
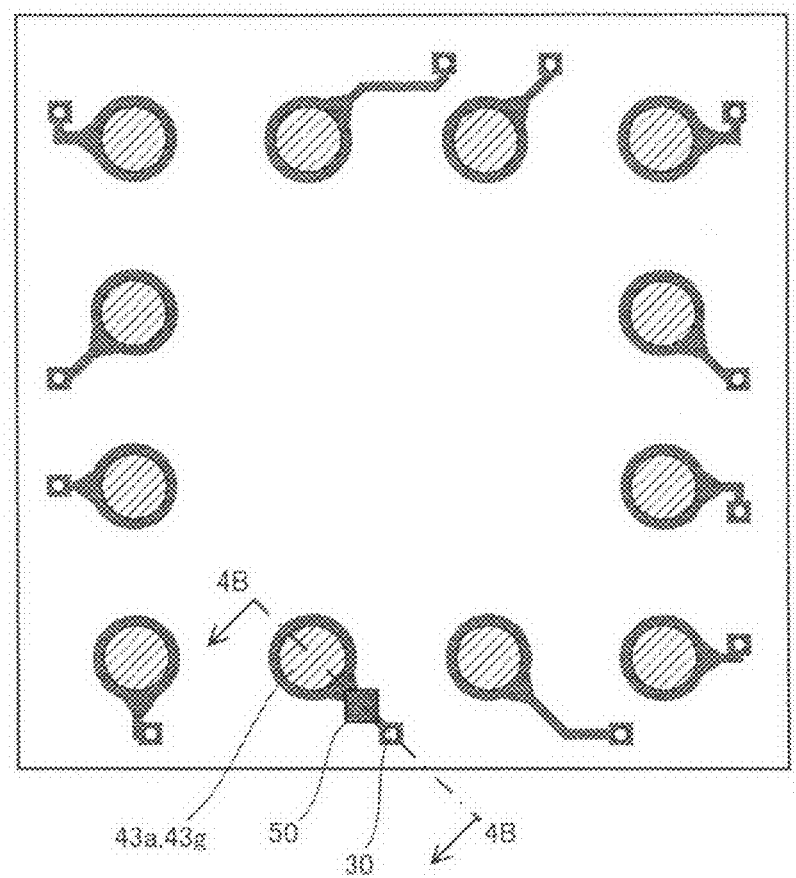
FIG. 4A is a plan view showing the configuration on the back side of a UV sensor that is another embodiment of the present invention.
Figure 4B:
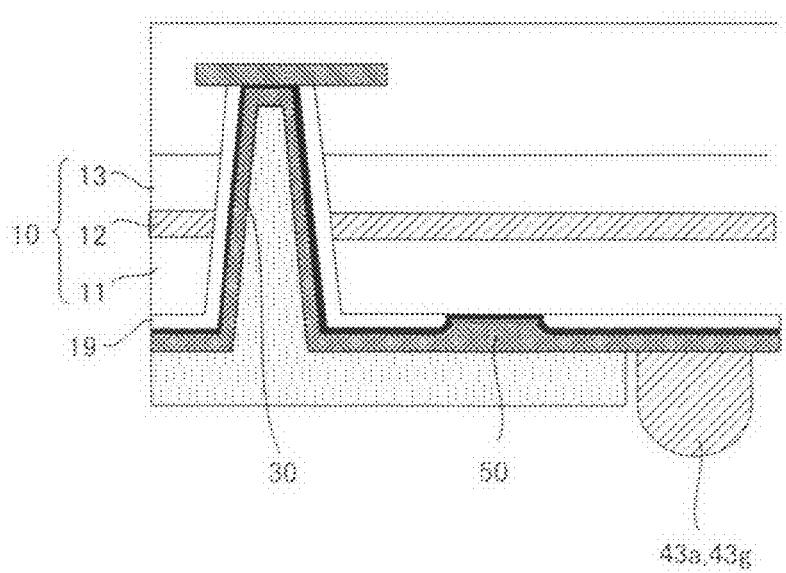
FIG. 4B is a cross-sectional view taken along line 4B-4B of FIG. 4A.
Figure 5A:
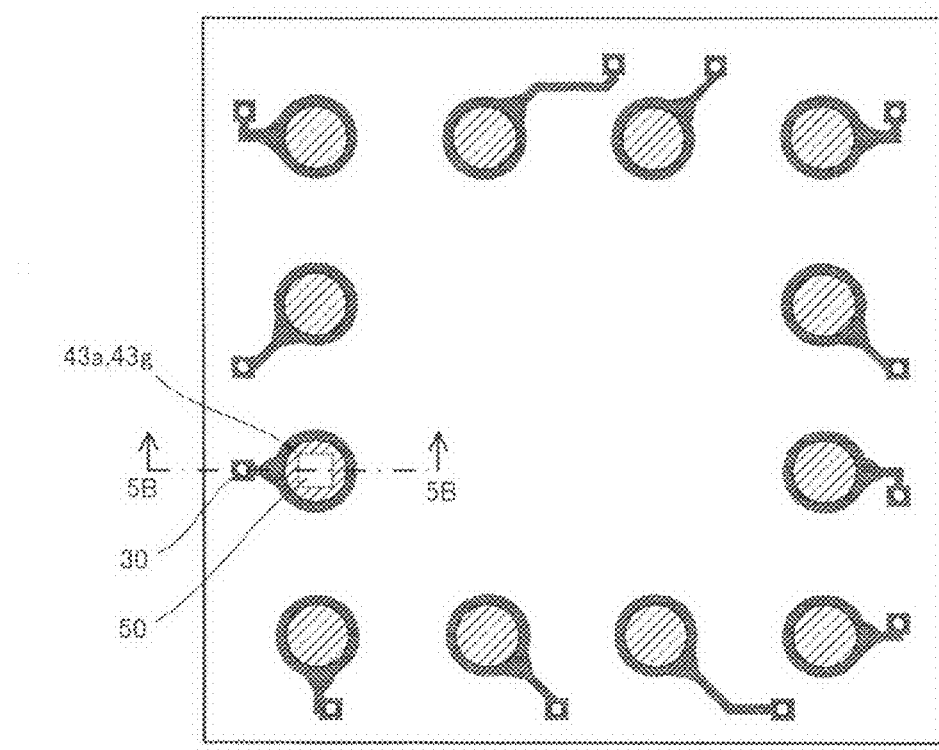
FIG. 5A is a plan view showing the configuration on the back side of a UV sensor that is another embodiment of the present invention.
Figure 5B:
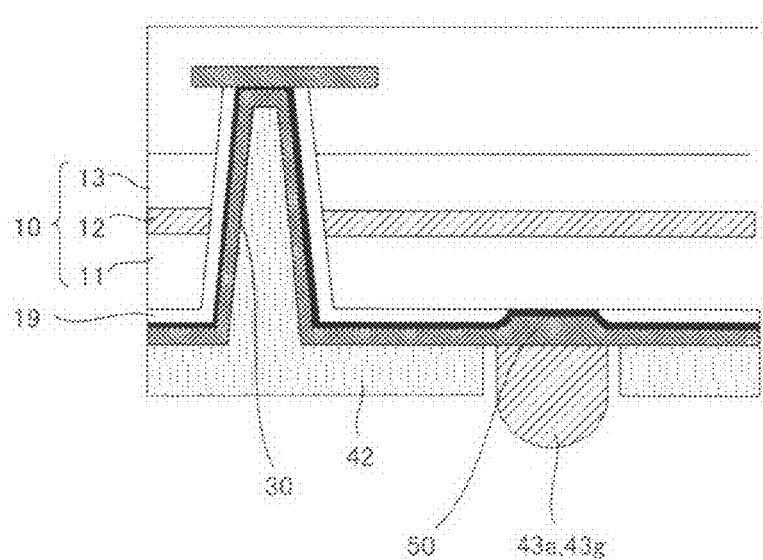
FIG. 5B is a cross-sectional view taken along line 5B-5B of FIG. 5A.

Further, there is no problem in the case where as shown in FIG. 3A an enough space to form the substrate layer contact 50 can be secured near the Gnd terminal 43g, but as the number of terminals increases, the density of back side lines 40 becomes higher, which may cause difficulty in securing a space where to form the substrate layer contact 50. For this case, as shown in FIGS. 4A, 4B, the substrate layer contact 50 can be formed on a back side line 40 connecting the back side electrode pad for the Gnd terminal 43g and a corresponding penetrating electrode 30. Moreover, as shown in FIGS. 5A, 5B, the substrate layer contact 50 can be formed immediately under the solder bump (back side electrode pad 41) constituting the Gnd terminal 43g. By placing the substrate layer contact 50 in this way, even the case where it is difficult to secure a space where to place the substrate layer contact 50 can be dealt with.

As described above, in the UV sensor 1 with the above configuration, because the substrate layer contact 50, the potential fixing external terminal 43a, and the back side line 40a connecting these are all provided on the main surface of the silicon substrate layer 11, it is easy to form the line path from the substrate layer contact 50 to the potential fixing external terminal 43a. Further, as described above, it is easy to change the arrangement of the substrate layer contact 50 and the potential fixing external terminal 43a, without an increase in package size. Yet further, since the potential fixing external terminal 43a is formed on the same surface and of the same structure as the other external terminals 43, the usability to users is not worsened.

Next, the fabrication method of the UV sensor 1 having the above structure will be described with reference to FIGS. 6A to 6E. FIGS. 6A to 6E are cross-sectional views respectively showing the steps of the fabrication process of the UV sensor 1.

Figure 6A:
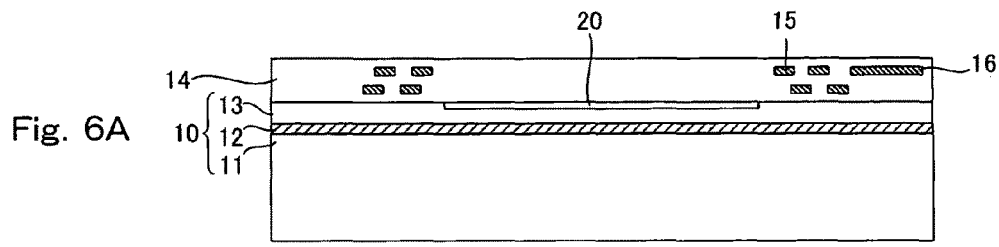
FIGS. 6A to 6E are cross-sectional views showing the fabrication process of the UV sensor that is an embodiment of the present invention.

First, the SOI substrate 10 having the silicon substrate layer 11, the BOX layer 12, and the SOI layer 13 laid one over another is prepared. The SOI substrate 10 may be made by any method such as a sticking method, a SIMOX (Silicon Implanted Oxide) method, or the like. In the SIMOX method, a high concentration of oxygen $O_2$ with high energy is ion-implanted into a prime wafer surface, and then implanted oxygen is made to react with silicon by heat treatment to form the BOX layer 12 of a $SiO_2$ film inside, near the wafer surface, thereby forming the SOI substrate 10. In contrast, in the sticking method, a wafer having a $SiO_2$ film formed on its surface and another wafer are stuck together by heat and pressure, and by grinding silicon on one side down to some depth, the SOI substrate 10 is formed. Thereafter, in order to obtain a desired spectral sensitivity characteristic, the thickness of the SOI layer 13 is adjusted by etching as needed. Subsequently, the sensor circuit 20 including a photodiode, an operational amplifier, and the like is formed in the SOI layer 13 by an existing method, and the multilayered lines 15 and the electrode pads 16 are formed in the interlayer insulating film 14 (FIG. 6A).

Figure 6B:
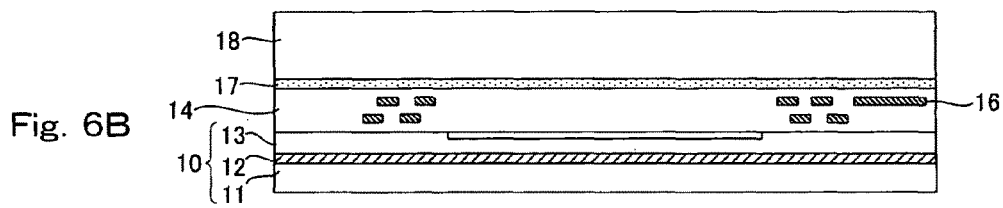

Next, after the UV-transparent adhesive 17 is coated over the interlayer insulating film 14, the UV-transparent cover glass 18 is stuck thereto. Subsequently, the silicon substrate layer 11 is polished to adjust the thickness of the SOI substrate 10 (FIG. 6B).

Then, after a photo-resist is coated over the surface of the silicon substrate layer 11, a resist mask (not shown) having openings in its parts where to form a through hole is formed by undergoing exposure and development. Thereafter, parts of the SOI substrate 10 exposed through the openings of the resist mask are etched from the back side to form through holes 34 reaching the electrode pads 16 in the interlayer insulating film 14.

Then, the insulating film 19 of $SiO_2$ or the like is deposited to cover the side walls of the through holes 34 and the main surface of the silicon substrate layer 11 by a CVD method.

Figure 6C:
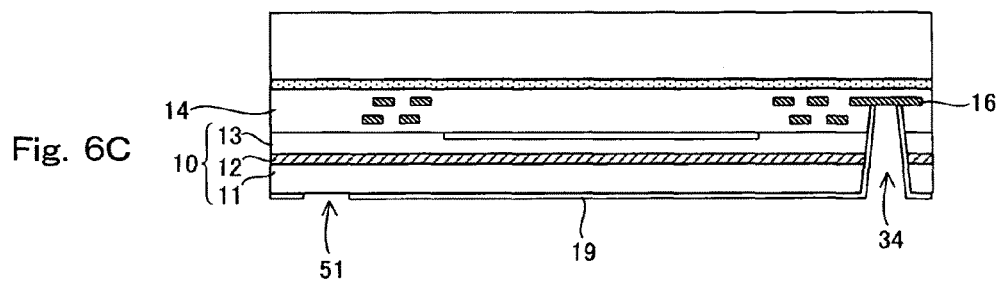

Then, a resist mask (not shown) having a predetermined mask pattern is formed on the main surface of the silicon substrate layer 11, and the insulating film 19 is selectively etched with this resist mask, thereby making the electrode pads 16 exposed at the bottom of the through holes 34. Subsequently, a photosensitive resist film is stuck over the main surface of the silicon substrate layer 11, and a resist mask (not shown) having an opening in its part corresponding to where to form the substrate layer contact 50 is formed by undergoing exposure and development. Then, the insulating film 19 is selectively etched with this resist mask, thereby forming a contact hole 51 (FIG. 6C). Thereafter, the resist film is removed by dissolving with an acid solution or ashing with oxygen plasma.

Figure 6D:
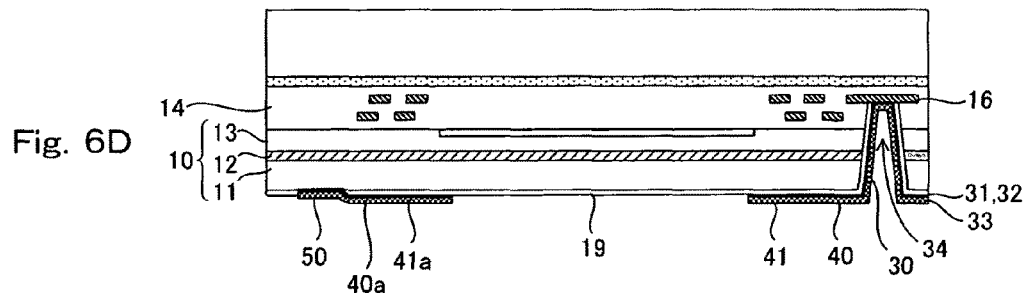

Next, the barrier metal 31 of Ti, Ti/Ni, or the like and the plating seed film 32 of Cu are sequentially formed on the inside walls of the through holes 34 and the main surface of the silicon substrate layer 11 by a sputtering method. Subsequently, an electrode is attached to the plating seed film 32, and the plating film 33 of Cu is formed on the inside walls of the through holes 34 by an electrolytic plating method, thereby forming the penetrating electrodes 30 electrically connected to the electrode pads 16 and the conductive film to form the back side lines on the main surface of the silicon substrate layer 11. The conductor lines forming the penetrating electrodes 30 and the conductive film to form the back side lines on the main surface of the silicon substrate layer 11 are insulated from the SOI substrate 10 by the insulating film 19. Further, in this process, a conductive film is formed on a part of the silicon substrate layer 11 exposed through the contact hole 51, thereby forming the substrate layer contact 50. Then, after a resist mask is formed on the conductive film on the main surface of the silicon substrate layer 11, the conductive film is etched with this resist mask, thereby forming the back side lines 40, 40a and the back side electrode pads 41, 41a in a desired pattern (FIG. 6D).

Figure 6E:
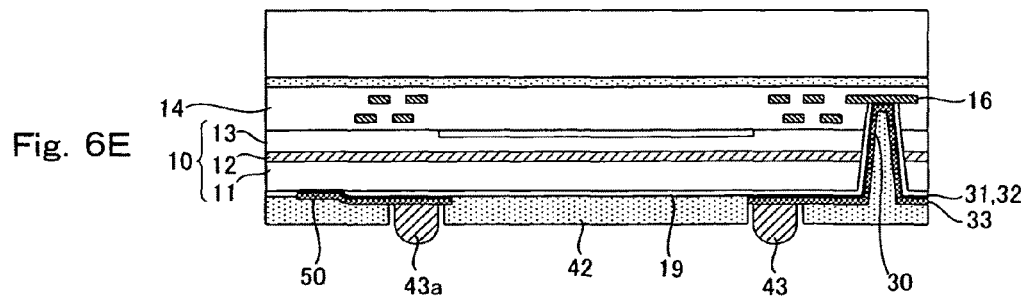

Then, the solder resist 42 made of light curing epoxy resin is coated to cover the entire main surface of the silicon substrate layer 11 having the back side lines 40, 40a and the like formed thereon. At this time, the insides of the through holes 34 are filled with the solder resist 42. Then, the solder resist 42 is exposed with a resist mask having a predetermined mask pattern to light-cure its exposed portions, and the unexposed portions of the solder resist 42 are selectively removed, thereby forming openings at positions where the back side electrode pads 41, 41a are formed. Then, solder bumps as the external terminals 43 and the potential fixing external terminal 43a are formed on the back side electrode pads 41, 41a exposed through the openings of the solder resist 42 by the electrolytic plating method or the like (FIG. 6E).

Next, this wafer is stuck at the cover glass 18 side to a wafer tape and divided into UV sensor chips by dicing. By undergoing the above process steps, the UV sensors 1 are finished.

According to the above-described fabrication method, the substrate layer contact 50 and the potential fixing external terminal 43a newly provided to fix the potential of the silicon substrate layer 11 can be formed without changing the process flow of the existing fabrication process, and substrate potential fixing means best suited for the W-CSP having the penetrating electrode structure can be easily formed. The formation of the configurations shown in FIGS. 1A to 5B can be dealt with by only changing masks for patterning for the contact hole 51 and the back side lines 40. Thus, the arrangement of the substrate layer contact 50 and the potential fixing external terminal 43a can be changed flexibly.

As obvious from the above description, according to the semiconductor device and the fabrication method of the semiconductor device of the present invention, in semiconductor devices of the W-CSP structure having penetrating electrodes that include an SOI device, potential fixing means for the silicon substrate layer of the SOI substrate can be formed without an increase in package size or the addition of a process step. That is, because the substrate layer contact 50 connected to the silicon substrate layer, the potential fixing external terminal 43a, and the back side line 40a connecting them are all provided on the back side of the SOI substrate, it is easy to form the line path from the substrate layer contact 50 to the potential fixing external terminal 43a, and also it is easy to change the arrangement of the substrate layer contact 50 and the potential fixing external terminal 43a as mentioned above, and the package size is not increased. Further, since the potential fixing external terminal 43a can be formed on the same surface and of the same structure as other functional terminals, the usability to users is not worsened. Yet further, since the step of forming the substrate layer contact 50, the potential fixing external terminal 43a, and the back side line 40a connecting them can be included in the process flow of the existing W-CSP, the number of process steps or processing time does not increase.

Figure 7:
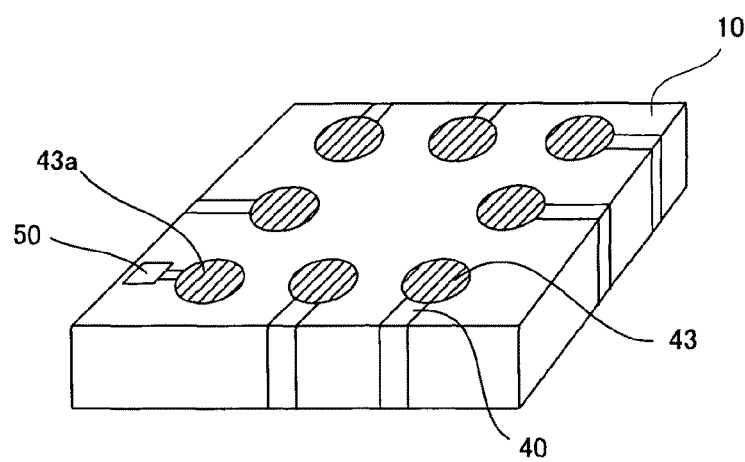
FIG. 7 is a perspective view showing another example structure of the semiconductor device of the present invention.
Figure 8:
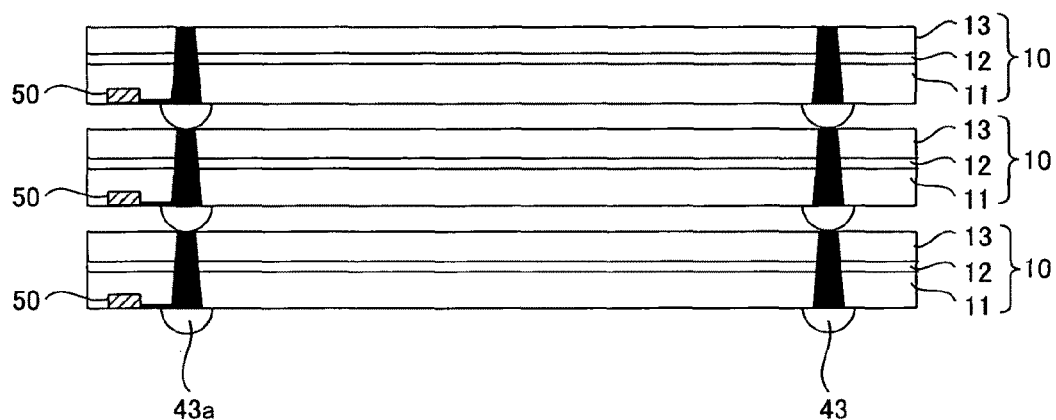
FIG. 8 is a cross-sectional view showing another example structure of the semiconductor device of the present invention.

Although in the above description the present invention is applied to semiconductor devices having the penetrating electrode structure, for example, as shown in FIG. 7, by connecting electrode pads (not shown) formed on the front side of the SOI substrate 10 and external terminals 43 formed on the back side via conductor lines 60 running across the side surface of the SOI substrate, the present invention can be applied to semiconductor devices having signal transfer paths formed along a thickness direction of the SOI substrate. Further, as shown in FIG. 8, the present invention can be applied to a three-dimensional mount type of package where a plurality of SOI substrates 10 having the penetrating electrodes 30 are laid one over another in a thickness direction. In packages of this structure, external terminals connected to the upper SOI substrate are connected to electrode pads situated at the top of the penetrating electrodes formed in the lower SOI substrate, thereby forming signal paths along the direction that the SOI substrates are laid one over another. Although in the above embodiments only one substrate layer contact is provided, the substrate layer contact may be provided at multiple places according to the size or the like of the SOI substrate used such that the potential distribution in the silicon substrate layer becomes uniform. Moreover, needless to say, the configuration of the present invention can also be applied to optical sensors such as image sensors configured with a CMOS sensor, a CCD, or the like formed in a semiconductor substrate, having a wide range of applications.

The present invention has been described with reference to preferred embodiments. It should be understood that those skilled in the art can think of various modifications and changes and that all variants made by those modifications and changes fall within the scope of the present invention as defined by the appended claims.

The present application claims priority from Japanese Patent Application No. 2008-189743, which is herein incorporated by reference.

What is claimed is:

1. A semiconductor device which comprises an SOI substrate having an insulating layer between a semiconductor substrate layer and a semiconductor layer in a surface of which a semiconductor element is formed, and at least one external terminal provided, via an insulating film, on a surface of said semiconductor substrate layer and electrically connected to said semiconductor element, said semiconductor device further comprising:
   a contact portion constituted by a conductive film reaching through said insulating film to electrically connect to said semiconductor substrate layer; and
   a potential fixing electrode provided, via said insulating film, on said surface of said semiconductor substrate layer and connected to said contact portion.

2. A semiconductor device according to claim 1, wherein the electrical connection between said semiconductor substrate layer and said contact portion is a Schottky contact.

3. A semiconductor device according to claim 1, wherein said contact portion is provided immediately under said potential fixing electrode.

4. A semiconductor device according to claim 1, further comprising:
   an electrode pad provided on the side facing said semiconductor-element-formed surface of said semiconductor layer and electrically connected to said semiconductor element;
   a penetrating electrode extending through said SOI substrate to electrically connect to said electrode pad; and
   a back side line provided, via said insulating film, on said surface of said semiconductor substrate layer and electrically connecting said penetrating electrode and said external terminal.

5. A semiconductor device according to claim 4, wherein said potential fixing electrode is electrically connected to said semiconductor element via said penetrating electrode.

6. A semiconductor device according to claim 4, wherein a plurality of said SOI substrates are laid one over another in their thickness direction and electrically connected to each other via said external terminal along the laid-one-over-another direction.

7. A semiconductor device according to claim 1, wherein said semiconductor element comprises a light receiving element, said semiconductor device further comprising:
   a transparent support substrate provided on said SOI substrate to cover said light receiving element.

* * * * *